(12) United States Patent
Li et al.

(10) Patent No.: US 9,188,629 B2
(45) Date of Patent: Nov. 17, 2015

(54) ELECTRONIC DEVICE AND PRINTED CIRCUIT BOARD TESTING METHOD

(71) Applicants: Fu Tai Hua Industry (Shenzhen) Co., Ltd., Shenzhen (CN); HON HAI PRECISION INDUSTRY CO., LTD., New Taipei (CN)

(72) Inventors: Yong Li, Shenzhen (CN); Yun-Qing Liu, Shenzhen (CN); Xi-Song Shuai, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 47 days.

(21) Appl. No.: 14/228,206

(22) Filed: Mar. 27, 2014

(65) Prior Publication Data

US 2014/0347080 A1     Nov. 27, 2014

(30) Foreign Application Priority Data

May 22, 2013   (CN) .......................... 2013 1 0192791

(51) Int. Cl.
*G01R 31/00* (2006.01)
*G01R 31/28* (2006.01)
(52) U.S. Cl.
CPC ................................. *G01R 31/2806* (2013.01)
(58) Field of Classification Search
CPC .................................................. G01R 31/2806

USPC ........... 324/71, 378, 403, 415, 425, 500, 537, 324/750.16, 750.18
See application file for complete search history.

(56) References Cited

U.S. PATENT DOCUMENTS

| 8,588,763 | B2 * | 11/2013 | Venkataraman | ............... | 455/423 |
| 2014/0119636 | A1 * | 5/2014 | Nava et al. | ..................... | 382/147 |
| 2014/0350769 | A1 * | 11/2014 | Li et al. | ........................... | 701/25 |

\* cited by examiner

*Primary Examiner* — Jermele M Hollington
*Assistant Examiner* — Raul Rios Russo
(74) *Attorney, Agent, or Firm* — Novak Druce Connolly Bove + Quigg LLP

(57) ABSTRACT

An exemplary printed circuit board testing method includes determining whether there is an open shielding box every a time interval. The method then transmits a first control signal including a first predetermined path to a robot when there is an open shielding box. Next, the method obtains an image captured by a camera and recognizes a unique identifier of a to-be-tested PCB in the obtained image. The method then determines a second predetermined path corresponding to the determined open shielding box, and transmits a second control signal comprising the determined second predetermined path to the robot. Next, the method closes the determined shielding box when a duration after transmitting the second control signal reaches a predetermined time, and controls a testing software to test the to-be-tested PCB, to generate a testing result corresponding to the unique identifier of the to-be-tested PCB.

15 Claims, 3 Drawing Sheets

ELECTRONIC DEVICE AND PRINTED CIRCUIT BOARD TESTING METHOD

BACKGROUND

1. Technical Field

The present disclosure relates to electronic devices, and particularly, to an electronic device capable of testing a printed circuit board (PCB) automatically.

2. Description of Related Art

A common PCB testing method of the radio frequency (RF) employs a number of shielding boxes to receive a number of PCBs to be tested (hereinafter to-be-tested PCBs). However, before testing, it needs an operator to find an open shielding box, carry the to-be-tested PCB into the open shielding box manually, and close the shielding box. Then, the operator must manually operate a testing button on the computer to start a processing of testing the PCB. And after the testing is completed, the operator must manually open the shielding box and carry the tested PCB out from the shielding box, which is time consuming and manpower consuming. Accordingly, there is a need for an electronic device to resolve the above problems.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The embodiments of the present disclosure are now described in detail, with reference to the accompanying drawings.

Figure 1:
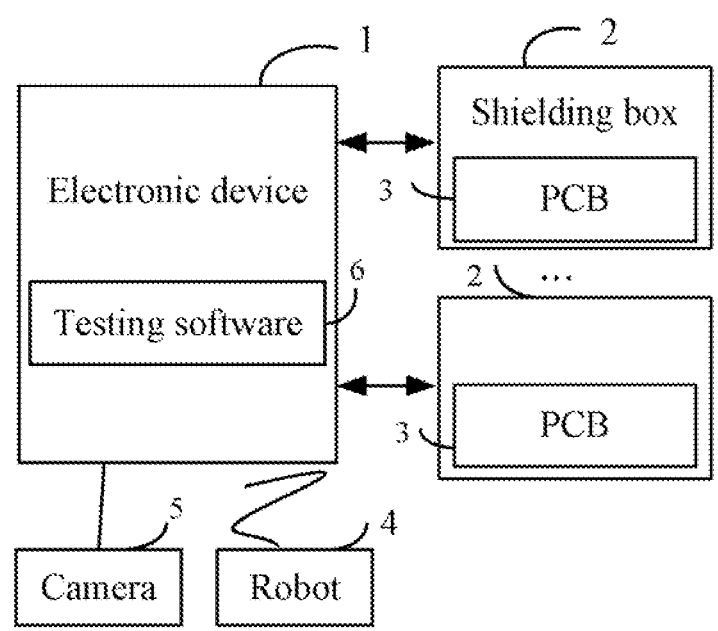
FIG. 1 is a schematic view showing an electronic device controlling a robot to test the to-be-tested PCB in accordance with an exemplary embodiment.
Figure 2:
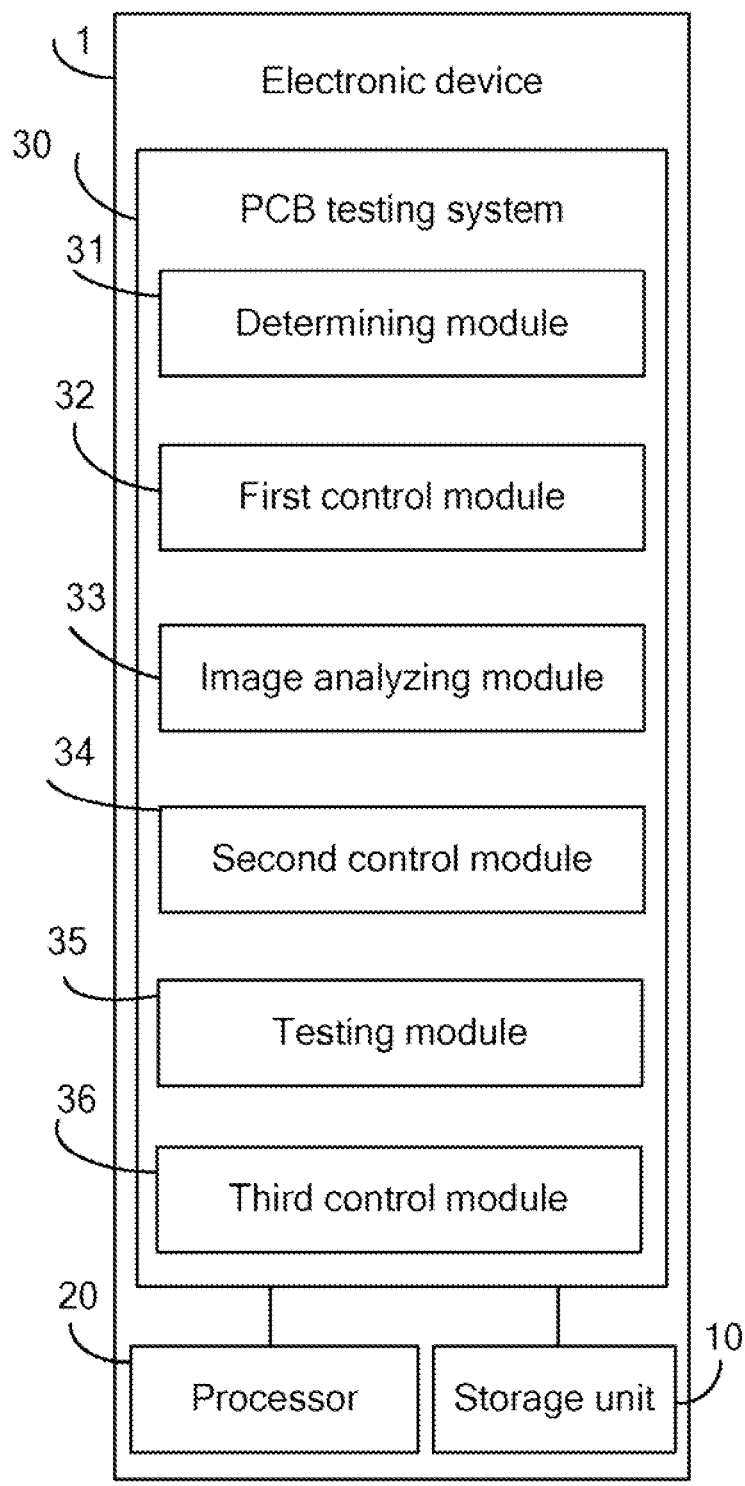
FIG. 2 is a block diagram showing the electronic device of FIG. 1.

FIGS. 1-2 show an embodiment of an electronic device 1. The electronic device 1 is connected to a number of shielding boxes 2 in a wired mode, such as, USB connection mode, for example. Each shielding box 2 receives a PCB 3 to be tested (hereinafter to-be-tested PCB). Each shielding box 2 includes a unique identifier. In the embodiment, the electronic device 1 includes a storage unit 10. The storage unit 10 stores the unique identifier of each shielding box 2. The electronic device 1 determines to open and close which shielding box 2 according to the unique identifier. When the shielding box 2 is open, the electronic device 1 marks the unique identifier corresponding to the open shielding box 2 stored in the storage unit 10 to identify that the shielding box 2 corresponding to the marked unique identifier is open. The electronic device 1 is connected to a robot 4 by a wireless mode, to control the robot 4 to move and operate. In the embodiment, the electronic device 1 further connects to a camera 5. A testing software 6 is embedded in the electronic device 1. The electronic device 1 can utilize the testing software 6 to test the to-be-tested PCB 3. Each PCB 3 includes a unique identifier. In the embodiment, the unique identifier of each PCB 3 is a series number. A preset position that each PCB 3 is placed in front of the camera 5 must make sure that the camera 5 can capture the unique identifier of the corresponding PCB 3, thus the electronic device 1 can determine the unique identifier of the PCB 3 according to an image captured by the camera 5. Before testing, the electronic device 1 determines the unique identifier of the to-be-tested PCB 3 and transmits the determined unique identifier of the to-be-tested PCB 3 to the testing software 6, thus the testing software 6 can generate a testing result corresponding to the unique identifier of the to-be-tested PCB 3, and a user can accordingly know which PCB is tested succeeded or failed. In the embodiment, the electronic device 1 determines the unique identifier of the to-be-tested PCB 3 according to the captured image of the to-be-tested PCB 3, controls the robot 4 to carry the to-be-tested PCB 3 into the open shielding box 2, and controls the testing software 6 to test the to-be-tested PCB 3 to generate the testing result corresponding to the unique identifier of the to-be-tested PCB 3.

In the embodiment, the electronic device 1 further includes a processor unit 20. A PCB testing system 30 is applied on the electronic device 1. In the embodiment, the PCB testing system 30 includes a determining module 31, a first control module 32, an image analyzing module 33, a second control module 34, and a testing module 35. One or more programs of the above function modules may be stored in the storage unit 10 and executed by the processor 20. In general, the word "module," as used herein, refers to logic embodied in hardware or firmware, or to a collection of software instructions, written in a programming language. The software instructions in the modules may be embedded in firmware, such as in an erasable programmable read-only memory (EPROM) device. The modules described herein may be implemented as either software and/or hardware modules and may be stored in any type of computer-readable medium or other storage device. In the embodiment, the processing unit 20 can be a central processing unit, a digital processor, a single chip, for example.

In the embodiment, the storage unit 10 stores a first predetermined path. The first predetermined path indicates a path from a depot to a preset position in front of the camera 5, thus the robot 4 can move from the depot to the preset position in front of the camera 5 along the first predetermined path. In the embodiment, the depot stores a number of to-be-tested PCBs 3. The storage unit 10 further stores a number of second predetermined paths each corresponding to one of the shielding boxes 2. Each second predetermined path indicates a path from the preset position in front of the camera 5 to the corresponding shielding box 2, thus the robot 4 can move from the preset position in front of the camera 5 to the shielding box 2 along the second predetermined path.

The determining module 31 determines whether there is an open shielding box 2 every a time interval. In detail, the determining module 31 searches the storage unit 10 to determine whether a marked identifier of the shielding box is existed in the storage unit 10. When a marked identifier of the shielding box is existed in the storage unit 10, the determining module 31 determines that the shielding box 2 corresponding to the marked identifier is open. When no marked identifier of the shielding box is existed in the storage unit 10, the determining module 31 determines that no shielding box 2 is open.

The first control module 32 transmits a first control signal including the first predetermined path to the robot 4 when there is an open shielding box 2 determined by the determining module 31, to control the robot 4 to carry the to-be-tested PCB 3 from the depot to the preset position in front of the camera 5 along the first predetermined path. Thus, the camera 5 can accordingly capture the image of the to-be-tested PCB 3.

The image analyzing module 33 obtains the image captured by the camera 5, recognizes the unique identifier of the to-be-tested PCB 3 in the obtained image, and transmits the recognized unique identifier of the to-be-tested PCB 3 to the testing software 6.

The second control module 34 determines the second predetermined path corresponding to the marked unique identifier of the shielding box, and transmits a second control signal including the determined second predetermined path to the robot 4, to control the robot 4 to carry the to-be-tested PCB 3 whose image has been captured by the camera 5 from the preset position in front of the camera 5 to the open shielding box 2 along the second predetermined path.

The testing module 35 closes the determined open shielding box 2 when a duration after the second control module 34 transmits the second control signal reaches a predetermined time, and controls the testing software 6 to test the to-be-tested PCB 3, to generate the testing result corresponding to the unique identifier of the to-be-tested PCB 3. Here, the predetermined time is greater than or equal to a duration that the robot 4 carries the to-be-tested PCB 3 from the camera 5 to the open shielding box 2.

In the embodiment, the PCB testing system 30 includes a third control module 36. The third control module 36 determines the unique identifier of the closed shielding box 2 in which the PCB 3 is tested completed (hereinafter tested PCB), opens the closed shielding box 2 according to the determined unique identifier, and transmits a third control signal to the robot 4, to control the robot 4 to carry the tested PCB 3 out from the open shielding box 2.

In the embodiment, the testing module 35 further cancels the mark of the unique identifier of the closed shielding box 2 stored in the storage unit 10 when the testing module 35 closes the determined open shielding box 2, and the third control module 36 further marks the determined unique identifier of the open shielding box 2 stored in the storage unit 10 when the third control module 36 opens the shielding box 2.

In the embodiment, the testing module 35 further records the testing result corresponding to the unique identifier of the to-be-tested PCB 3 in the storage unit 10.

Figure 3:
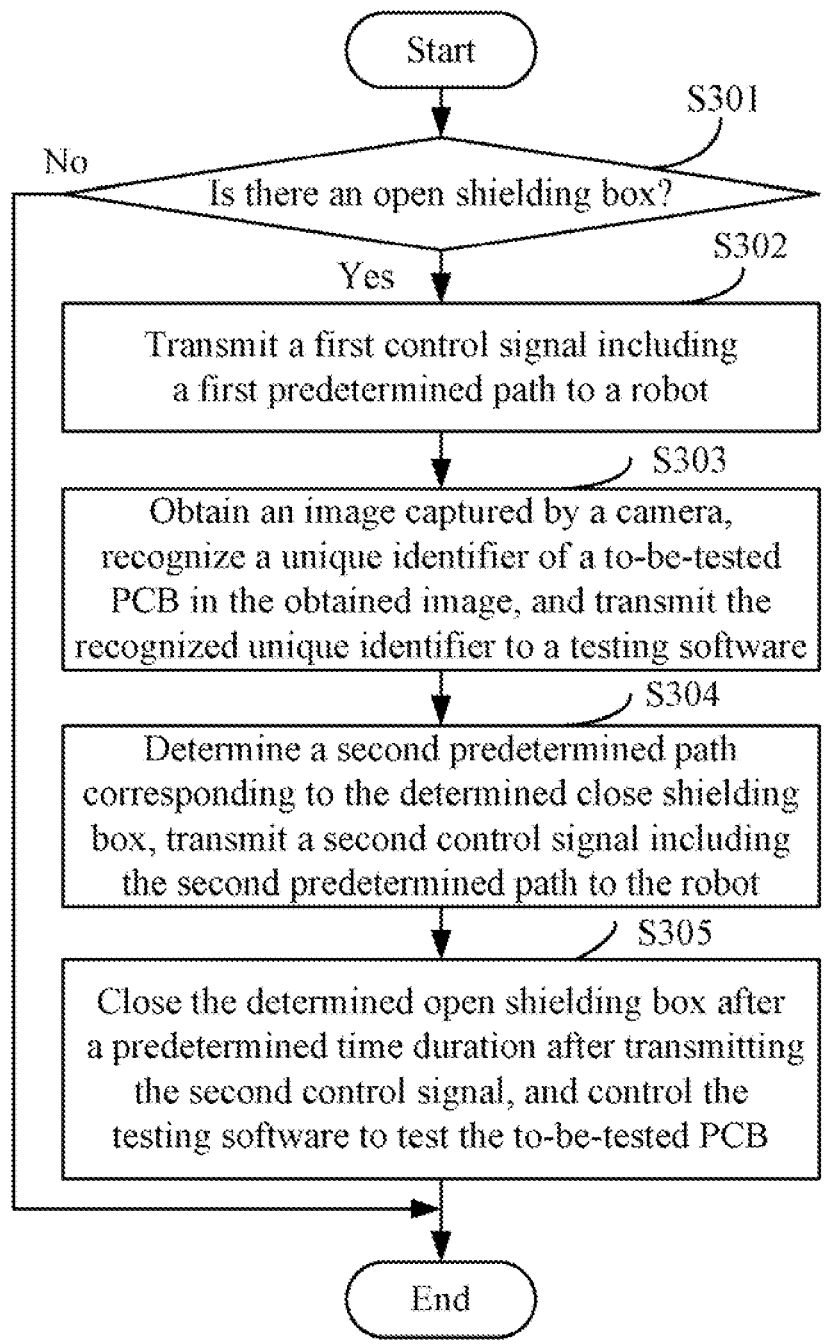
FIG. 3 is a flowchart of a PCB testing method in accordance with an exemplary embodiment.

FIG. 3 shows a flowchart of a PCB testing method in accordance with an exemplary embodiment.

In step S301, the determining module 31 determines whether there is an open shielding box 2 every a time interval. If there is an open shielding box 2, the procedure goes to step S302. If there is no open shielding box 2, the procedure is ended. In detail, the determining module 31 searches the storage unit 10 to determine whether a marked identifier of the shielding box is existed in the storage unit 10. When a marked identifier of the shielding box is existed in the storage unit 10, the determining module 31 determines the shielding box 2 corresponding to the marked identifier is open.

In step S302, the first control module 32 transmits a first control signal including a first predetermined path to the robot 4, to control the robot 4 to carry the to-be-tested PCB 3 from the depot to the preset position in front of the camera 5 along the first predetermined path.

In step S303, the image analyzing module 33 obtains an image captured by the camera 5, recognizes the unique identifier of the to-be-tested PCB 3 in the obtained image, and transmits the recognized unique identifier of the to-be-tested PCB 3 to the testing software 6.

In step S304, the second control module 34 determines the second predetermined path corresponding to the marked unique identifier of the shielding box, and transmits a second control signal including the determined second predetermined path to the robot 4, to control the robot 4 to carry the to-be-tested PCB 3 whose image has been captured by the camera 5 from the preset position in front of the camera 5 to the open shielding box 2 along the second predetermined path.

In step S305, the testing module 35 closes the determined open shielding box 2 when a duration after the second control module 34 transmits the second control signal reaches a predetermined time, and controls the testing software 6 to test the to-be-tested PCB 3, to generate the testing result corresponding to the unique identifier of the to-be-tested PCB 3.

In this way, the electronic device 1 can monitor the open and the close of the shielding box 2 and control the robot 4 to execute the test of the PCB 3 without manpower, which saves time and manpower.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An electronic device connected to a plurality of shielding boxes, a robot, and a camera, each of the shielding boxes capable of receiving a to-be-tested printed circuit board (PCB), each of the shielding boxes and each of the PCBs respectively comprising a unique identifier, the electronic device comprising:

a storage system storing a first predetermined path, the unique identifier of each of the shielding boxes, and a plurality of second predetermined paths each corresponding to one of the shielding boxes; the first predetermined path indicating a path from a depot storing a plurality of to-be-tested PCBs to a preset position in front of the camera; the unique identifier of each of the shielding boxes capable of being marked to identify that the shielding box corresponding to the marked unique identifier is open; each of the second predetermined paths indicating a path from the preset position in front of the camera to the corresponding shielding box;

a processor;

one or more programs stored in the storage system, executed by the processor, the one or more programs comprising:

a determining module operable to determine whether there is an open shielding box every a time interval;

a first control module operable to transmit a first control signal comprising the first predetermined path to the robot when there is an open shielding box, to control the robot to carry the to-be-tested PCB from the depot to the preset position in front of the camera along the first predetermined path;

an image analyzing module operable to obtain an image captured by the camera, recognize the unique identifier of the to-be-tested PCB in the obtained image, and transmit the recognized unique identifier of the to-be-tested PCB to a testing software;

a second control module operable to determine the second predetermined path corresponding to a marked unique identifier of the shielding box, and transmit a second control signal comprising the determined second predetermined path to the robot, to control the robot to carry the to-be-tested PCB whose image has been captured by the camera from the preset position in front of the camera to the open shielding box along the second predetermined path; and a testing module operable to close the determined open shielding box when a duration after the second control module transmits the second control signal reaches a predetermined time, and control a testing software to test the to-be-tested PCB, to generate a testing result corresponding to the unique identifier of the to-be-tested PCB.

2. The electronic device as described in claim 1, wherein the determining module is operable to:
search the storage system to determine whether one marked unique identifier of the shielding box is existed in the storage system;
determine that the shielding box corresponding to the marked unique identifier is open when one marked unique identifier of the shielding box is existed in the storage system; and
determine that no shielding box is open when no marked unique identifier of the shielding box is existed in the storage system.

3. The electronic device as described in claim 1, further comprising a third control module, wherein the third control module is operable to determine the unique identifier of the closed shielding box in which the PCB is tested completed, open the closed shielding box according to the determined unique identifier, and transmit a third control signal to the robot, to control the robot to carry the tested PCB out from the open shielding box.

4. The electronic device as described in claim 3, wherein the testing module further cancels the mark of the unique identifier of the closed shielding box stored in the storage system when the testing module closes the determined open shielding box, and the third control module further marks the determined unique identifier of the open shielding box stored in the storage system when the third control module opens the shielding box.

5. The electronic device as described in claim 1, wherein the testing module is further operable to record the testing result corresponding to the unique identifier of the to-be-tested PCB in the storage system.

6. A printed circuit board testing method comprising:
providing a storage system storing a first predetermined path, a number of unique identifiers of shielding boxes, and a plurality of second predetermined paths each corresponding to one of the shielding boxes; the first predetermined path indicating a path from a depot storing a plurality of to-be-tested PCBs to a preset position in front of a camera; each shielding boxes comprising a unique identifier, each unique identifier of the shielding box capable of being marked to identify that the shielding box corresponding to the marked unique identifier is open; each of the second predetermined paths indicating a path from the preset position in front of the camera to the corresponding shielding box;
determining whether there is an open shielding box every a time interval;
transmitting a first control signal comprising the first predetermined path to a robot when there is an open shielding box, to control the robot to carry the to-be-tested PCB from the depot to the preset position in front of the camera along the first predetermined path;
obtaining an image captured by the camera, recognizing the unique identifier of the to-be-tested PCB in the obtained image, and transmitting the recognized unique identifier of the to-be-tested PCB to a testing software; each to-be-tested PCB comprising a unique identifier;
determining the second predetermined path corresponding to a marked unique identifier of the shielding box, and transmitting a second control signal comprising the determined second predetermined path to the robot, to control the robot to carry the to-be-tested PCB whose image has been captured by the camera from the preset position in front of the camera to the open shielding box along the second predetermined path; and
closing the determined open shielding box when a duration after transmitting the second control signal reaches a predetermined time, and controlling the testing software to test the to-be-tested PCB, to generate a testing result corresponding to the unique identifier of the to-be-tested PCB.

7. The printed circuit board testing method as described in claim 6, wherein the method further comprises:
searching the storage system to determine whether one marked unique identifier of the shielding box is existed in the storage system;
determining that the shielding box corresponding to the marked unique identifier is open when one marked unique identifier of the shielding box is existed in the storage system; and
determining that no shielding box is open when no marked unique identifier of the shielding box is existed in the storage system.

8. The printed circuit board testing method as described in claim 6, wherein the method further comprises:
determining the unique identifier of the closed shielding box in which the PCB is tested completed, opening the closed shielding box according to the determined unique identifier, and transmitting a third control signal to the robot, to control the robot to carry the tested PCB out from the open shielding box.

9. The printed circuit board testing method as described in claim 6, wherein the method further comprises:
cancelling the mark of the unique identifier of the closed shielding box stored in the storage system upon closing the determined open shielding box; and
marking the determined unique identifier of the open shielding box stored in the storage system upon opening the shielding box.

10. The printed circuit board as described in claim 6, wherein the method further comprises:
recording the testing result corresponding to the unique identifier of the to-be-tested PCB in the storage system.

11. A storage medium storing a set of instructions, the set of instructions capable of being executed by a processor of an electronic device, causing the electronic device to perform a printed circuit board testing method, the method comprising:
providing a storage system storing a first predetermined path, a number of unique identifiers of shielding boxes, and a plurality of second predetermined paths each corresponding to one of the shielding boxes; the first predetermined path indicating a path from a depot storing a plurality of to-be-tested PCBs to a preset position in front of a camera; each shielding boxes comprising a unique identifier, each unique identifier of the shielding box capable of being marked to identify that the shielding box corresponding to the marked unique identifier is open; each of the second predetermined paths indicating a path from the preset position in front of the camera to the corresponding shielding box;
determining whether there is an open shielding box every a time interval;
transmitting a first control signal comprising the first predetermined path to a robot when there is an open shielding box, to control the robot to carry the to-be-tested PCB from the depot to the preset position in front of the camera along the first predetermined path;

obtaining an image captured by the camera, recognizing the unique identifier of the to-be-tested PCB in the obtained image, and transmitting the recognized unique identifier of the to-be-tested PCB to a testing software; each to-be-tested PCB comprising a unique identifier;

determining the second predetermined path corresponding to a marked unique identifier of the shielding box, and transmitting a second control signal comprising the determined second predetermined path to the robot, to control the robot to carry the to-be-tested PCB whose image has been captured by the camera from the preset position in front of the camera to the open shielding box along the second predetermined path; and closing the determined open shielding box when a duration after transmitting the second control signal reaches a predetermined time, and controlling the testing software to test the to-be-tested PCB, to generate a testing result corresponding to the unique identifier of the to-be-tested PCB.

12. The storage medium as described in claim 11, wherein the method further comprises:

searching the storage system to determine whether one marked unique identifier of the shielding box is existed in the storage system;

determining that the shielding box corresponding to the marked unique identifier is open when one marked unique identifier of the shielding box is existed in the storage system; and determining that no shielding box is open when no marked unique identifier of the shielding box is existed in the storage system.

13. The storage medium as described in claim 11, wherein the method further comprises:

determining the unique identifier of the closed shielding box in which the PCB is tested completed, opening the closed shielding box according to the determined unique identifier, and transmitting a third control signal to the robot, to control the robot to carry the tested PCB out from the open shielding box.

14. The storage medium as described in claim 11, wherein the method further comprises:

cancelling the mark of the unique identifier of the closed shielding box stored in the storage system upon closing the determined open shielding box; and marking the determined unique identifier of the open shielding box stored in the storage system upon opening the shielding box.

15. The storage medium as described in claim 11, wherein the method further comprises:

recording the testing result corresponding to the unique identifier of the to-be-tested PCB in the storage system.

* * * * *